United States Patent [19]

Fukuda et al.

[11] Patent Number: 5,601,638
[45] Date of Patent: Feb. 11, 1997

[54] THICK FILM PASTE

[75] Inventors: Junzo Fukuda, Nagoya; Akio Harada, Osaka; Susumu Nishigaki, Nagoya, all of Japan

[73] Assignees: Sumitomo Metal (SMI) Electronics Devices Inc., Mine; Daiken Chemical Company, Osaka, both of Japan

[21] Appl. No.: 560,710

[22] Filed: Nov. 20, 1995

[30] Foreign Application Priority Data

Nov. 21, 1994 [JP] Japan .................................. 6-286448

[51] Int. Cl.$^6$ ........................... C09D 11/14; C23C 20/04; C23C 20/06
[52] U.S. Cl. ..................... 106/19 C; 106/1.18; 252/512
[58] Field of Search ................................ 106/1.18, 1.19, 106/19 C; 252/512, 514

[56]  References Cited

U.S. PATENT DOCUMENTS

| | | | |
|---|---|---|---|
| 4,381,945 | 5/1983 | Nair ........................................ | 106/1.19 |
| 4,391,742 | 7/1983 | Steigerwald et al. .................. | 106/1.18 |
| 4,394,171 | 7/1983 | Nair ........................................ | 252/514 |
| 4,400,214 | 8/1983 | Ogawa et al. ......................... | 252/512 |
| 4,419,279 | 12/1983 | Abrams ................................. | 106/1.18 |
| 4,425,263 | 1/1984 | Nazarenko ............................ | 106/1.18 |
| 4,663,186 | 5/1987 | Indyk et al. .......................... | 427/57 |
| 5,306,333 | 4/1994 | Dershem ............................... | 106/1.19 |

OTHER PUBLICATIONS

Patent Abstracts of Japan, vol. 3, No. 143 (E–154), 27 Nov. 1979 & JP–A–54 121996 (Hitachi) 21 Sep. 1979.

Research Disclosure, No. 309, Jan. 1990 Havant GB, p. 41 XP 000099326, 30959: "New class of MLC (Multi Layer Ceramic) pastes".

Primary Examiner—Helene Klemanski
Attorney, Agent, or Firm—Flynn, Thiel, Boutell & Tanis, P.C.

[57]  ABSTRACT

A thick film paste for use in the formation of a conductor, a resistor, an insulator, a protector or the like in a ceramic wiring substrate by a printing process, wherein at least 2-tetradecanol as a solvent is contained in an amount of at least 3% by weight. The thick film paste is excellent in printability, for example, has less viscosity change during printing and exhibits less bleeding.

11 Claims, No Drawings

THICK FILM PASTE

BACKGROUND OF THE INVENTION

1. Field of the Invention

The present invention relates to a thick film paste which is used for the formation of a conductor, a resistor, an insulator, a protector or the like, in a ceramic wiring substrate by a screen printing process, and which is excellent in printability.

2. Description of Prior Art

A ceramic wiring substrate is produced by, for example, a process comprising screen printing a conductor paste for wiring on a fired ceramic or unfired green sheet substrate, further screen printing an insulating paste for an insulating layer thereon, drying, repeating the foregoing procedure, and firing. Beside the above conductor and insulating pastes, pastes for a resistor and a protector are applied according to necessity. These pastes are mainly used in a screen printing process, so that they are collectively called a thick film paste.

Generally, a thick film paste is prepared, for example, by adding conductive powder, such as metal powder, and insulating powder, such as ceramic or glass powder (for the preparation of a conductor paste), or an electrically resistive component, such as one based on $RuO_2$ (for the preparation of a resistor paste), to a mixture of an organic resin and a solvent, which is called a vehicle. In the conventional vehicle, for example/ethyl cellulose or acrylic resin is used as an organic resin and butyl carbitol acetate, α-terpineol or β-terpineol is used as a solvent.

For example, U.S. Pat. No. 4,394,171 (Japanese Patent Laid-Open No. 31509/1983) describes a thick film conductor composition containing a vehicle composed of ethyl cellulose (organic resin) and β-terpineol (solvent).

The conventional thick film paste using the above vehicle has a drawback in that a viscosity increase occurs during printing to thereby affect the printability. The viscosity increase would result in rendering the separation of the paste from the printing plate unsuccessful to thereby cause pinholes and, in extreme cases, cause wire breakage in the conductor and short circuit in the insulating layer. The reason for the viscosity change is that the use of an organic solvent necessitates care for ventilation and exhaust during printing and drying and the solvent is evaporated to thereby bring about an increase in the paste viscosity during printing. The conventional thick film paste has another drawback in that bleeding sometimes occurs during printing. The occurrence of bleeding in a conductor paste for wiring deteriorates fine line quality. The cause of the bleeding is poor wettability of a solvent to conductive metal powders such as Ag, Au, Pd, Pt, etc.

SUMMARY OF THE INVENTION

An object of the present invention is to provide a thick film paste for a ceramic wiring substrate whose viscosity change and bleeding during printing are so slight as to ensure an excellent printability of the thick film paste.

The inventors have made intensive studies and, as a result, they have found that the above object can be attained by incorporating a specified compound as a solvent in a thick film paste, thereby arriving at the present invention.

That is, the present invention relates to a thick film paste which is used for the manufacture of a ceramic wiring substrate by a screen printing process and which comprises inorganic particles dispersed in a vehicle comprising an organic resin and a solvent, and, according to necessity, further includes an inorganic binder, the solvent containing 2-tetradecanol.

For the thick film paste, it is preferred that 2-tetradecanol be contained in an amount of at least 3% by weight and that the vehicle comprise 5 to 25% by weight of an organic resin and 95 to 75% by weight of a solvent.

The inorganic particles of the thick film paste are conductive powder (for a conductor paste), electrically resistive powder (for a resistor paste), insulating powder (for an insulating paste) or protector powder (for a paste for a protective layer) depending on the type of the paste, and are used in combination with an inorganic binder, such as glass, according to necessity.

DETAILED DESCRIPTION OF THE PREFERRED EMBODIMENTS

In the thick film paste of the present invention, 2-tetradecanol (isotetradecanol) constituting part or the whole of the solvent has a higher boiling point, a lower evaporation rate and a less power of dissolving or swelling the green sheet than those of other solvents as apparent from Table 1. The evaporation rate given in Table 1 is a measurement obtained by putting each solvent in a vessel of 1 $cm^2$ in liquid surface area, allowing it to stand still at a test temperature for a given period of time, and determining the evaporation rate.

TABLE 1

| Solvent | boiling point (°C.) | Evaporation rate (g/$cm^2$ · Hr) | |
| --- | --- | --- | --- |
| | | 80° C. | 100° C. |
| 2-tetradecanol | 276 | 0.5 | 3.6 |
| butyl carbitol acetate | 247 | 2.5 | 7.6 |
| α-terpineol | 213 | 7.5 | 16.5 |

In the present invention, 2-tetradecanol as a solvent should be contained in the thick film paste in an amount of at least 3% by weight and it is preferred that the 2-tetradecanol content be at least 5% by weight. When the 2-tetradecanol content is less than 3% by weight, the object and effects of the present invention cannot be fully achieved. The whole of the solvent may be 2-tetradecanol. In this case, the balance is composed of desired inorganic particles of a conductive powder, an insulating powder or an electrically resistive powder, optionally together with an inorganic binder or the like, and a resin component. Conventionally employed butyl carbitol acetate, α-terpineol or the like can be mentioned as a solvent suitable for use in combination with 2-tetradecanol, which is, however, in no way limited thereto. Also, conventionally employed ethyl cellulose, polyvinyl butyral, acrylic resin or the like can be mentioned as the organic resin of the vehicle, which is, however, in no way limited thereto.

With respect to the proportion of the organic resin to the solvent in the vehicle, it is preferred that the organic resin and solvent contents be 5 to 25% by weight and 95 to 75% by weight, respectively, for obtaining a paste exhibiting an excellent printability. The weight ratio of the vehicle to the inorganic particles is not particularly limited and is regulated depending on the powder properties of the inorganic particles.

When the thick film paste of the present invention is a conductor paste, the conductive powder is not particularly limited. However, when the conductive powder is co-fired with green sheets, the conductive powder is varied depending on the substrate material. A high-melting metal such as molybdenum or tungsten is used as the conductive powder on a substrate material such as alumina or aluminum nitride to be fired at relatively high temperatures. On the other hand, a metal such as gold, silver, silver-palladium alloy, copper or nickel is used on a substrate material which can be fired at relatively low temperatures. The above conductive powder is mixed with glass powder according to necessity and dispersed in a vehicle to give a paste.

When the thick film paste is a resistor paste, for example, $RuO_2$ or an $RuO_2$-based pyrochlore compound is used as an electrically resistive powder and dispersed together with glass powder in a vehicle to give a paste. When the thick film paste is an insulating paste, $Al_2O_3$ or $Al_2O_3$ with glass or crystallizable glass can be used as insulating powders. Further, when the thick film paste is a protector paste such as an overcoat paste or the like, fillers of glass, glass/$SiO_2$ or $Al_2O_3$ can be used as inorganic particles. Whatever the paste is, it is not limited to those mentioned above and conventional materials can appropriately be utilized.

The ceramic material for use in the above ceramic substrate is not particularly limited, and alumina ($Al_2O_3$), aluminum nitride (AlN), silicon carbide (SiC) and various ceramics composed mainly of the above materials can be mentioned as examples thereof. Further, use can be made of a low-temperature firing ceramic in which glass powder is mixed in alumina ceramic.

The ceramic wiring substrate in which the thick film paste of the present invention is printed may have any of monolayer and multilayer structures as long as the ceramic is used as an insulator, and examples of the process for producing the multilayer ceramic wiring substrate include thick film multilayer printing and green-sheet multilayer lamination processes. Further, the circuit may be provided on only one side or both sides of the substrate.

The above two processes for producing the multilayer ceramic wiring substrate will be described. In the thick film multilayer printing process, a conductor paste and an insulating paste are alternately printed by a screen printing process on a fired ceramic substrate and fired. According to necessity, a resistor paste can be printed. An Ag- or Cu-based paste is generally used as a conductive powder.

On the other hand, in the green-sheet multilayer lamination process, first, each green sheet is provided with registration-holes and through holes, and the through holes are filled with a conductor paste and a conductor paste is printed thereon. Finally, the resultant green sheets are laminated one upon another, subjected to thermocompression bonding to thereby integrate them, and fired.

The present invention will now be described in greater detail with reference to Examples and Comparative Example.

EXAMPLE 1

$CaO-Al_2O_3-SiO_2-B_2O_3$ system glass powder and $\alpha$-$Al_2O_3$ powder were mixed with an acrylic resin and an organic solvent such as toluene or ethanol in a ball mill and formed into ceramic green sheets, each of 0.3 mm in thickness, by a doctor blade method.

100 parts by weight of Ag flat powder having an average particle size of 5 μm and a vehicle consisting of 3 parts by weight of ethyl cellulose dissolved in 17 parts by weight of 2-tetradecanol were used as printing paste materials. The above components were mixed by means of a three-roll mill to thereby give a conductor paste of a given viscosity (Example 1 in Table 2).

The above conductor paste was continuously printed at room temperature (25° C.) on 1000 green sheets cut so as to have a given size by the use of a conventional screen printing machine. The viscosity of the paste was measured before and after the printing operation, thereby determining the rate of viscosity change. In this printing, a 250-mesh screen was used and patterns of 120 μm in width were printed. The printed face was examined as to the state of paste bleeding around the given print patterns. The results showed that the viscosity increased from 2510 P (poise) before the printing to 2660 P after the printing, exhibiting a viscosity change of +6%, and that only a very slight bleeding occurred on the printed face (Example 1 in Table 3).

EXAMPLES 2 TO 5

Conductor pastes (Examples 2 and 3), a resistor paste (Example 4) and an insulating paste (Example 5) were prepared by varying the inorganic particles and inorganic binder as specified in Table 2 and also by varying the organic resin component and organic solvent constituting a vehicle as specified in Table 2, and the same experiments as in Example 1 were carried out except that the pastes of Examples 3 and 4 were respectively printed on fired 96% $Al_2O_3$ substrates. The printability evaluation results of each paste are given in Table 3.

COMPARATIVE EXAMPLE 1

The same experiment as in Example I was carried out except that a conductor paste was prepared using 100 parts by weight of the Ag powder used in Example 1, 25 parts by weight of conventional butyl carbitol acetate as an organic solvent in place of the 2-tetradecanol and 4 parts by weight of ethyl cellulose. The printability evaluation results are also given in Table 3.

TABLE 2

| Ex. No. | Inorganic particles or inorganic binder (parts by weight) | | Organic resin (parts by weight) | | Solvent (parts by weight) | | Proportion of 2-tetradecanol in paste (% by weight) | Proportion of organic resin in vehicle (% by weight) |
| --- | --- | --- | --- | --- | --- | --- | --- | --- |
| 1 | Ag | 100 | ethyl cellulose | 3 | 2-tetradecanol | 17 | 14.2 | 15 |
| 2 | Ag | 80 | ethyl cellulose | 6 | 2-tetradecanol | 5 | 3.6 | 15 |
|   | Pd | 20 |   |   | butyl carbitol acetate | 29 |   |   |
| 3 | Au | 95 | ethyl cellulose | 2 | 2-tetradecanol | 6 | 5.0 | 9.5 |
|   | $B_2O_3$—$SiO_2$—PbO system glass | 5 |   |   | butyl carbitol acetate | 13 |   |   |

TABLE 2-continued

| | Inorganic particles or inorganic binder (parts by weight) | | Organic resin (parts by weight) | | Solvent (parts by weight) | | Proportion of 2-tetradecanol in paste (% by weight) | Proportion of organic resin in vehicle (% by weight) |
|---|---|---|---|---|---|---|---|---|
| 4 | $RuO_2$ | 30 | ethyl cellulose | 4.5 | 2-tetradecanol | 60 | 30.8 | 5.3 |
| | $CaO\text{—}Al_2O_3\text{—}SiO_2\text{—}B_2O_3$ system glass | 70 | polyvinyl butyral | 0.5 | α-terpineol | 30 | | |
| 5 | $Cr_2O_3\text{—}CaO\text{—}Al_2O_3\text{—}SiO_2\text{—}B_2O_3$ system glass | 100 | ethyl cellulose | 10 | 2-tetradecanol | 18 | 8.6 | 9.1 |
| | | | | | α-terpineol | 82 | | |
| Comparative Ex. | | | | | | | | |
| 1 | Ag | 100 | ethyl cellulose | 4 | butyl carbitol acetate | 25 | 0.0 | 14 |

TABLE 3

Evaluation of Printability

| | Rate of viscosity change* | | | |
|---|---|---|---|---|
| Ex. No. | before printing (P) | after printing (P) | rate of change (%) | max. bleeding after printing (μm) |
| 1 | 2510 | 2660 | +6 | 20 |
| 2 | 2610 | 2920 | +12 | 0 |
| 3 | 2580 | 2840 | +10 | 20 |
| 4 | 2360 | 2510 | +6 | 30 |
| 5 | 1420 | 1600 | +13 | 30 |
| Comparative Ex. 1 | 2200 | 3090 | +40 | 80 |

*The rate of viscosity change was determined by measuring the viscosities before and after continuous screen printing of 1000 sheets and the mark "+" means a viscosity increase.
Rate of viscosity change (%) = [(viscosity after printing − viscosity before printing)/(viscosity before printing)] × 100

As apparent from the foregoing, the thick film paste of the present invention has an excellent printability such that the rate of viscosity change occurring when it is printed as a conductor, a resistor, an insulator, a protector, or the like, for a ceramic wiring substrate is slight and that the bleeding after printing is also slight. Consequently, the thick film paste of the present invention contributes to an efficient production of a ceramic wiring substrate with a high wiring density.

What is claimed is:

1. A thick film paste for use in the preparation of a ceramic wiring substrate by a printing process, which comprises inorganic particles dispersed in a vehicle comprising an organic resin and a solvent, optionally together with an inorganic binder, said solvent comprising 2-tetradecanol or a mixture of 2-tetradecanol and another solvent.

2. The thick film paste according to claim 1, wherein 2-tetradecanol is contained in an amount of at least 3% by weight.

3. The thick film paste according to claim 1, wherein the vehicle comprises 5 to 25% by weight of an organic resin and 95 to 75% by weight of a solvent.

4. The thick film paste according to claim 1, wherein the organic resin is ethyl cellulose, polyvinyl butyral or a mixture of ethyl cellulose and polyvinyl butyral.

5. The thick film paste according to claim 1, wherein the inorganic particles are composed of conductive powder.

6. The thick film paste according to claim 5, which contains an inorganic binder composed of glass.

7. The thick film paste according to claim 1, wherein the inorganic particles are composed of electrically resistive powder.

8. The thick film paste according to claim 7, which contains an inorganic binder composed of glass.

9. The thick film paste according to claim 1, wherein the inorganic particles are composed of insulating powder.

10. The thick film paste according to claim 1, wherein the inorganic particles are composed of protector powder.

11. The thick film paste according to claim 1, wherein the other solvent is butyl carbitol acetate or α-terpineol.

* * * * *